United States Patent
Ishizaka et al.

(10) Patent No.: US 8,034,406 B2
(45) Date of Patent: Oct. 11, 2011

(54) INTEGRATED SUBSTRATE PROCESSING IN A VACUUM PROCESSING TOOL

(75) Inventors: Tadahiro Ishizaka, Watervliet, NY (US); Masamichi Hara, Yamanashi (JP); Yasushi Mizusawa, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 1211 days.

(21) Appl. No.: 11/526,767

(22) Filed: Sep. 26, 2006

(65) Prior Publication Data

US 2008/0075835 A1     Mar. 27, 2008

(51) Int. Cl.
*C23C 16/00*     (2006.01)
*C23C 14/00*     (2006.01)

(52) U.S. Cl. ............. 427/248.1; 427/255.23; 427/255.7; 204/192.1; 204/192.11

(58) Field of Classification Search .................... 427/58, 427/250, 255.7
See application file for complete search history.

(56) References Cited

U.S. PATENT DOCUMENTS

| | | | |
|---|---|---|---|
| 5,747,361 A * | 5/1998 | Ouellet ........................ | 438/643 |
| 6,592,725 B2 | 7/2003 | Lin et al. | |
| 6,767,832 B1 * | 7/2004 | Kumar et al. ................ | 438/689 |
| 2004/0048461 A1 | 3/2004 | Chen et al. | |
| 2005/0081882 A1 * | 4/2005 | Greer et al. .................... | 134/1.1 |
| 2005/0098109 A1 * | 5/2005 | Wakabayashi et al. ....... | 118/715 |
| 2005/0260833 A1 * | 11/2005 | McFeely et al. .............. | 438/485 |
| 2006/0033678 A1 | 2/2006 | Lubomirsky et al. | |
| 2006/0110530 A1 | 5/2006 | Suzuki et al. | |
| 2006/0211198 A1 | 9/2006 | Horng et al. | |
| 2006/0211246 A1 | 9/2006 | Ishizaka et al. | |

OTHER PUBLICATIONS

Kaloyeros et al, "Blanket and Selective Copper CVD from Cu(FOD)2 for Multilevel Metallization," 1990, Mat. Res. Soc. Symp. Proc. Vo. 181, p. 79-84.*

* cited by examiner

*Primary Examiner* — Timothy Meeks
*Assistant Examiner* — Mandy Louie
(74) *Attorney, Agent, or Firm* — Oblon, Spivak, McClelland, Maier & Neustadt, L.L.P.

(57) ABSTRACT

A method and system are provided for integrated substrate processing in Cu metallization. The method includes providing a substrate in a vacuum processing tool containing a plurality of processing systems configured to process the substrate and a substrate transfer system configured to transfer the substrate under vacuum conditions between the plurality of processing systems, and performing an integrated deposition process on the substrate. The plurality of processing systems and the substrate transfer system maintain a base pressure of background gases at $6.8 \times 10^{-8}$ Torr or lower, preferably $5 \times 10^{-8}$ Torr or lower, during the integrated deposition process. According to one embodiment, the integrated process includes depositing a barrier metal layer on the substrate, and depositing a Cu layer on the barrier metal layer. According to another embodiment, the integrated process further includes depositing a Ru layer on the barrier metal layer, and depositing a Cu layer on the Ru layer.

17 Claims, 5 Drawing Sheets

INTEGRATED SUBSTRATE PROCESSING IN A VACUUM PROCESSING TOOL

FIELD OF THE INVENTION

The present invention generally relates to a method and vacuum processing tool for integrated substrate processing for Cu metallization.

BACKGROUND OF THE INVENTION

An integrated circuit contains various semiconductor devices and a plurality of conducting metal paths that provide electrical power to the semiconductor devices and allow these semiconductor devices to share and exchange information. Within the integrated circuit, metal layers are stacked on top of one another using intermetal or interlayer dielectric layers that insulate the metal layers from each other.

Normally, each metal layer must form an electrical contact to at least one additional metal layer. Such electrical contact is achieved by etching a hole (i.e., a via) in the interlayer dielectric that separates the metal layers, and filling the resulting via with a metal to create an interconnect. Metal layers typically occupy etched pathways in the interlayer dielectric. A "via" normally refers to any feature such as a hole, line or other similar feature formed within a dielectric layer that provides an electrical connection through the dielectric layer to a conductive layer underlying the dielectric layer. Metal layers connecting two or more vias on the same dielectric layer are normally referred to as trenches.

The use of copper (Cu) metal in multilayer metallization schemes for manufacturing integrated circuits creates problems due to high mobility of Cu atoms in dielectrics, such as $SiO_2$, and Cu atoms may create electrical defects in Si. Thus, Cu metal layers, Cu filled trenches, and Cu filled vias are normally encapsulated with a barrier material to prevent Cu atoms from diffusing into the dielectrics and substrate material, such as Si. Barrier layers are normally deposited on the sidewalls and bottom of a trench or via prior to Cu seed deposition, and may include materials that are preferably non-reactive and immiscible in Cu, provide good adhesion to the dielectrics and can offer low electrical resistivity.

An increase in device performance is normally accompanied by a decrease in device area or an increase in device density. An increase in device density requires a decrease in via and trench dimensions resulting in larger aspect ratio (i.e., depth to width ratio) metallization features. As metallization feature dimensions decrease, and aspect ratios increase, it becomes increasingly more challenging to form diffusion barrier layers with adequate thickness on the sidewalls and/or bottom of such features. In addition, as via and trench dimensions decrease and the thicknesses of the layers in the vias and trenches decrease, the material properties of the layers and the layer interfaces become increasingly more important. In particular, the present inventors have recognized that impurity levels of metallization features that may have been previously acceptable can cause manufacturing yield and/or device reliability problems as device scaling continues.

SUMMARY OF THE INVENTION

Accordingly, one object of the present invention is to address any of the above or other problems related to metallization processes.

Another object of the invention is to carefully integrate the process of forming barrier layers into a manufacturable process sequence where control is maintained for all steps in the process sequence.

A method and system is provided for integrated substrate processing in Cu metallization. The integrated substrate processing can provide excellent adhesion of bulk Cu to the underlying metal-containing layers by reducing or eliminating incorporation of impurities from background gases into the metal-containing layers and at the interfaces of the metal-containing layers.

According to one embodiment, a method of integrated substrate processing is provided. The method includes providing a substrate in a vacuum processing tool containing a plurality of processing systems configured for processing the substrate and a substrate transfer system configured for transferring the substrate under vacuum conditions between the plurality of processing systems, and performing an integrated deposition process on the substrate, where the plurality of processing systems and the substrate transfer system maintain a base pressure of background gases at $6.8\times10^{-8}$ Torr, or lower, during the integrated deposition process. Following the integrated deposition process, bulk Cu is plated onto the substrate.

According to one embodiment, the integrated deposition process includes depositing a barrier metal layer on the substrate, and depositing a Cu layer on the barrier metal layer. The barrier metal layer can include TaN, TaCN, Ta, TaC, TiN, Ti, WN, and W.

According to another embodiment, the integrated deposition process includes depositing a first barrier metal layer on the substrate, depositing a second barrier metal layer on the first barrier metal layer, and depositing a Cu layer on the second barrier metal layer. The first and second barrier metal layers may contain alternating Ta-containing layers, including TaN, TaCN, TaC, and Ta, alternating Ti-containing layers, including TiN and Ti, alternating W-containing layers, including WN and W, or a combination of alternating Ta-containing layers, alternating Ti-containing layers, and alternating W-containing layers.

According to yet another embodiment, the integrated deposition process includes depositing a barrier metal layer on the substrate, and depositing a Ru layer on the barrier metal layer.

According to still another embodiment, the integrated deposition process includes depositing a barrier metal layer on the substrate, depositing a Ru layer on the barrier metal layer, and depositing a Cu layer on the Ru layer.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF SEVERAL EMBODIMENTS OF THE INVENTION

Figure 1A:
FIGS. 1A-1C schematically show formation of a multilayer structure according to an embodiment of the invention.

Embodiments of the invention provide integrated processing of a substrate in a vacuum processing tool. The integrated processing includes deposition of a plurality of metal-containing layers on a substrate in a Cu metallization scheme. According to embodiments of the invention, deposition of the metal-containing layers is carefully integrated under vacuum conditions to minimize incorporation of impurities such as oxygen atoms into the metal-containing layers during the layer deposition and between layer deposition steps. It has been demonstrated that impurities can greatly affect the physical properties of the metal-containing layers and the interfaces between the metal-containing layers. In one example, surface oxidation of a tantalum (Ta) layer prior to Cu metallization can result in poor adhesion of the Cu layer to the Ta layer, thereby affecting the reliability of a semiconductor device containing the Cu metallization, particularly for devices having high aspect ratio features.

The current inventors have realized that maintaining a base pressure of background gases at $6.8 \times 10^{-8}$ Torr or lower, preferably $5 \times 10^{-8}$ Torr or lower, during the integrated process of depositing a plurality of metal-containing layers on a substrate, results in relatively low impurity levels within each metal-containing layer and at the interfaces between the metal-containing layers. Background gases in vacuum processing systems typically include $H_2O$, $N_2$, and $O_2$, but may also include organic gases such as alcohols.

The effect of different base pressures of background gases during integrated processing was examined by varying the base pressure in the vacuum processing tool. Multilayer structures were prepared that contained a patterned substrate, a TaN layer deposited onto the patterned substrate, a Ta layer deposited onto the TaN layer, a Cu layer deposited onto the Ta layer, and bulk Cu plated onto the Cu layer. A first multilayer structure was prepared by depositing the TaN and Ta layers in a ionized physical vapor deposition (IPVD) processing system having a base pressure of $9.7 \times 10^{-9}$ Torr, transferring the patterned substrate by a substrate transfer system having a base pressure of $6.8 \times 10^{-8}$ Torr to a Cu IPVD processing system having a base pressure of $1.7 \times 10^{-8}$ Torr, and depositing a Cu layer. Thus, the highest pressure of the background gases during preparation of the first multilayer structure was $6.8 \times 10^{-8}$ Torr. Next, the patterned substrate was transferred through air to a plating system for Cu plating. A second multilayer structure was prepared by depositing the TaN and Ta layers in an IPVD processing system having a base pressure of $1.2 \times 10^{-7}$ Torr, transferring the patterned substrate by the substrate transfer system having a base pressure of $6.8 \times 10^{-8}$ Torr to the Cu IPVD processing system having a base pressure of $1.7 \times 10^{-8}$ Torr, and depositing a Cu layer. Thus, the highest pressure of the background gases during preparation of the second multilayer structure was $1.2 \times 10^{-7}$ Torr. Next, the patterned substrate was transferred through air to a plating system for Cu plating. The base pressure in the TaN/Ta IPVD processing system was raised from $9.7 \times 10^{-9}$ Torr to $1.2 \times 10^{-7}$ Torr by raising the wall temperature of the IPVD processing system from room temperature to 80° C. The increase in the base pressure was believed to be dominantly caused by $H_2O$ outgassing from the processing system walls.

Following Cu plating, the multilayer structures were annealed at 400° C. for 4 hours and thereafter cleaved and analyzed by cross-sectional scanning electron microscope (SEM). The analysis showed delamination of the bulk Cu from the TaN/Ta barrier metal layer due to oxidation of the TaN/Ta barrier metal layer by the background gas (mainly $H_2O$) at the higher base pressure of $1.2 \times 10^{-7}$ Torr in the TaN/Ta IPVD system. The delamination was caused by poor adhesion of the bulk Cu to the TaN/Ta barrier metal layer oxidized by the background gas. In comparison, no delamination was observed for the lower base pressure of $9.7 \times 10^{-9}$ Torr. Thus, a base pressure lower than $1.2 \times 10^{-7}$ Torr, for example a base pressure of $6.8 \times 10^{-8}$ Torr or lower, is preferred during the deposition of the barrier metal layer, during subsequent transfer of the substrate to the next processing system, and during the next processing step (e.g., Cu layer deposition).

According to one embodiment of the invention, a base pressure of about $5 \times 10^{-8}$ Torr, or lower, is maintained during the integrated deposition process so as to provide a buffer of confidence that unacceptable impurities, delamination or other problems will not occur. Of course, even lower base pressures could be preferable. Each deposition process in the integrated substrate processing described herein may utilize a processing time on the order of about 1-3 min. Commonly, impurity incorporation into multilayer structures during processing is a function of the product of base pressure and processing time. Therefore, short processing times may allow relatively high base pressure while long processing times may require lower base pressure. Further, since the present inventors have recognized that an acceptable base pressure of background gases can be related to the feature sizes that are being produced, a base pressure that provides acceptable impurity levels and minimizes delamination and other problems can be determined for a particular process, and applied to the process according to the present invention.

Accordingly, one embodiment of the invention provides a method of integrated substrate processing by providing a substrate in a vacuum processing tool containing a plurality of processing systems configured for processing the substrate and a substrate transfer system configured for transferring the substrate under vacuum conditions between the plurality of processing systems. An integrated deposition process is performed on the substrate, where the plurality of processing systems and the substrate transfer system maintain a base pressure of background gases at $6.8 \times 10^{-8}$ Torr or lower, preferably $5 \times 10^{-8}$ Torr or lower, during the integrated deposition process. Integrated processes for depositing metal-containing layers according to embodiments of the invention are described in reference to FIGS. 1-4 and discussed below.

Figure 5:
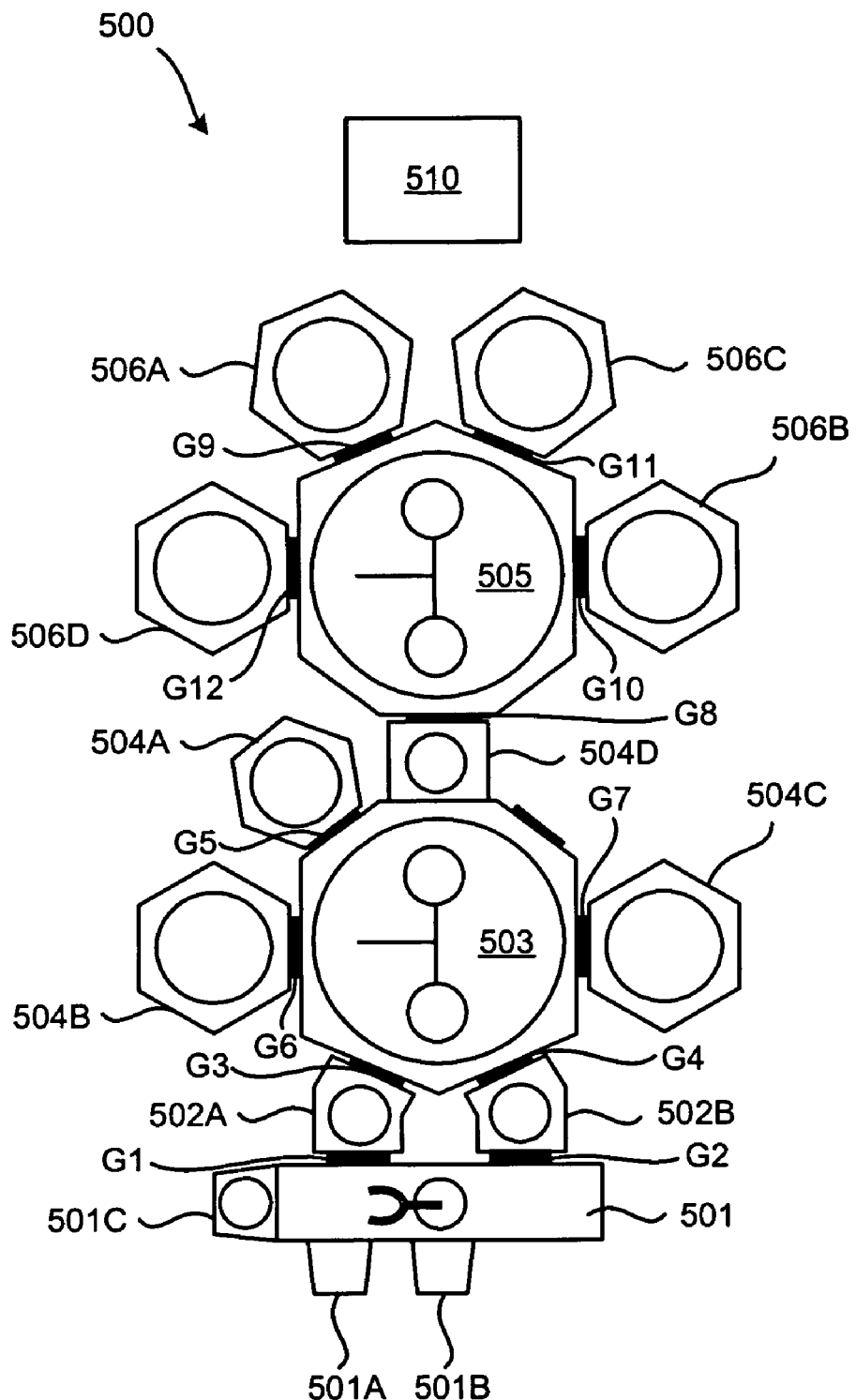
FIG. 5 is a schematic diagram of a vacuum processing tool for performing integrated processing according to embodiments of the invention.

FIG. 5 is a schematic diagram of a vacuum processing tool according to an embodiment of the invention. The vacuum processing tool 500 contains a substrate (wafer) transfer system 501 that includes cassette modules 501A and 501B, and a substrate alignment module 501C. Load-lock chambers 502A and 502B are coupled to the substrate transfer system 501 using gate valves G1 and G2, respectively. The substrate transfer system 501 is maintained at atmospheric pressure, but a clean environment is provided by purging with an inert gas. It should be noted that the term "substrate transfer system" may be used to refer to all or a portion of the transfer components of a system such as the vacuum processing tool 500.

The load lock chambers 502A and 502B are coupled to a substrate transfer system 503 using gate valves G3 and G4. According to one embodiment of the invention, the substrate transfer system 503 may be maintained at a base pressure of $6.8 \times 10^{-8}$ Torr or lower, preferably $5 \times 10^{-8}$ Torr or lower, using a turbomolecular pump integrated with a water pump (not shown). The substrate transfer system 503 includes a substrate transfer robot and is coupled to degassing system 504A, precleaning system 504B for precleaning a substrate prior to deposition, and auxiliary processing system 504C.

The processing systems 504A, 504B, and 504C are coupled to the substrate transfer system 503 using gate valves G5, G6, and G7, respectively.

Furthermore, the substrate transfer system 503 is coupled to a substrate transfer system 505 through substrate handling chamber 504D and gate valve G8. As in the substrate transfer system 503, the substrate transfer system 505 may be maintained at a base pressure of $6.8 \times 10^{-8}$ Torr or lower, preferably $5 \times 10^{-8}$ Torr or lower, using a turbomolecular pump integrated with a water pump (not shown). The substrate transfer system 505 includes a substrate transfer robot. Coupled to the substrate transfer system 505 are processing systems 506A and 506D configured for depositing first and second barrier metal layers on a substrate, processing system 506B configured for depositing a Cu layer on a substrate, and processing system 506C configured for depositing a Ru layer on a substrate. According to one embodiment of the invention, the processing systems 506A-506D may be ionized physical vapor deposition (IPVD) systems. An exemplary IPVD system is described in U.S. Pat. No. 6,287,435, which is incorporated by reference herein in its entirety.

According to one embodiment of the invention, the processing system 506C may be a chemical vapor deposition (CVD) system for depositing a Cu layer.

According to one embodiment of the invention, one or both of processing systems 506A and 506D may be configured for plasma-enhanced atomic layer deposition (PEALD) using a source gas and a reducing gas that are alternately exposed to the substrate with purge/evacuation steps between the alternating exposures. Source gases that may be utilized for depositing Ta-containing layers such as TaN, TaCN, and TaC, can include metal organic compounds such as tertiaryamylimidotris(dimethylamido)tantalum $(Ta(NC(CH_3)_2 C_2H_5)(N(CH_3)_2)_3$, TAIMATA), pentakis(diethylamido) tantalum $(Ta[N(C_2H_5)_{\ 2}]_5$, PDEAT), pentakis(ethylmethylamido) tantalum $(Ta[N(C_2H_5CH_3)]_5$, PEMAT), pentakis methylamido tantalum $(Ta[N(CH_3)_2]_5$, PDMAT), t-butylimino tris(diethylamino) tantalum $(Ta(NC(CH_3)_3)(N(C_2H_5)_2)_3$, TBTDET), $Ta(NC_2H_5)(N(C_2H_5)_2)_3$, $Ta(NC(CH_3)_3)(N(CH_3)_2)_3$, tert-butyl-tris-ethylmethylamido tantalum $(Ta(NC(CH_3)_3)((NC_2H_5(CH_3)_3)_3$, TBTEMAT), $Ta(NC(CH_3)_2)_3$, $Ta(NC_2H_5)_2)_3$, $Ta(\eta^5-C_5H_5)_2H_3$, $Ta(CH_2)(CH_3)(\eta^5-C_5H_5)_2$, $Ta(\eta^3-C_3H_5)(\eta^5-C_5H_5)_2$, $Ta(CH_3)_3(\eta^5-C_5H_5)_2$, $Ta(CH_3)_4(\eta^5-C_5(CH_3)_5)$, or $Ta(\eta^5-C_5(CH_3)_5)_2H_3)$. Source gases that may be utilized for depositing a Ta layers can include $TaF_5$, $TaCl_5$, $TaBr_5$, and $TaI_5$.

According to one embodiment of the invention, the processing system 506C may be a Ru CVD system, or Ru thermal chemical vapor deposition (TCVD) system, utilizing a process gas containing $Ru_3(CO)_{12}$ and CO. One example of a Ru CVD system is described in U.S. patent application Ser. No. 10/996,145, entitled METHOD AND DEPOSITION SYSTEM FOR INCREASING DEPOSITION RATES OF METAL LAYERS FROM METAL-CARBONYL PRECURSORS, the entire content of which is herein incorporated by reference. The processing systems 506A, 506B, 506C, and 506D are coupled to the vacuum substrate transfer system 505 using gate valves G9, G10, G11, and G12, respectively.

According to embodiments of the invention, the substrate transfer system 505 and processing systems 506A-506D are capable of maintaining a base pressure of background gases at $6.8 \times 10^{-8}$ Torr or lower, preferably $5 \times 10^{-8}$ Torr or lower, during the integrated deposition process to enable forming a multilayer structure with excellent film and film interface properties. In one example, the substrate transfer system 505 and the processing systems 506A-506D may be pumped by turbomolecular pumps integrated with water pumps. As those skilled in the art will readily recognize, a base pressure of $6.8 \times 10^{-8}$ Torr or lower, preferably $5 \times 10^{-8}$ Torr or lower, may be reached and maintained by carefully selecting the materials used to construct the processing systems and substrate transfer systems of the vacuum processing system 500.

The vacuum processing tool 500 includes a controller 510 that can be coupled to and control any or all of the processing systems and processing elements depicted in FIG. 5 during the integrated substrate processing. Alternatively, or in addition, controller 510 can be coupled to one or more additional controllers/computers (not shown), and controller 510 can obtain setup and/or configuration information from an additional controller/computer. The controller 510 can be used to configure any or all of the processing systems and processing elements, and the controller 510 can collect, provide, process, store, and display data from any or all of the processing systems and processing elements. The controller 510 can comprise a number of applications for controlling any or all of the processing systems and processing elements. For example, controller 510 can include a graphic user interface (GUI) component (not shown) that can provide easy to use interfaces that enable a user to monitor and/or control one or more processing systems and processing elements.

The controller 510 can include a microprocessor, memory, and a digital I/O port capable of generating control voltages sufficient to communicate, activate inputs, and exchange information with the vacuum processing tool 500 as well as monitor outputs from the vacuum processing tool 500. For example, a program stored in the memory may be utilized to activate the inputs of the vacuum processing tool 500 according to a process recipe in order to perform integrated substrate processing. One example of the controller 510 is a DELL PRECISION WORKSTATION 610™, available from Dell Corporation, Austin, Tex.

However, the controller 510 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 510 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 510, for driving a device or devices for implementing the invention, and/or for enabling the controller 510 to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 510 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 510.

The controller 510 may be locally located relative to the vacuum processing tool 500, or it may be remotely located relative to the vacuum processing tool 500. For example, the controller 510 may exchange data with the vacuum processing tool 500 using at least one of a direct connection, an intranet, the Internet and a wireless connection. The controller 510 may be coupled to an intranet at, for example, a customer site (i.e., a device maker, etc.), or it may be coupled to an intranet at, for example, a vendor site (i.e., an equipment manufacturer). Additionally, for example, the controller 510 may be coupled to the Internet. Furthermore, another computer (i.e., controller, server, etc.) may access, for example, the controller 510 to exchange data via at least one of a direct connection, an intranet, and the Internet. As also would be appreciated by those skilled in the art, the controller 510 may exchange data with the vacuum processing tool 500 via a wireless connection.

As those skilled in the art will readily recognize, embodiments of the invention may not require the use of all the processing systems of the vacuum processing tool 500 depicted in FIG. 5. For example, according to one embodiment, only processing system 506A or processing system 506C may be required for depositing a barrier metal film on the substrate. Thus, some embodiments of the invention may include the use of less than all the processing systems depicted in FIG. 5.

Figure 1B:
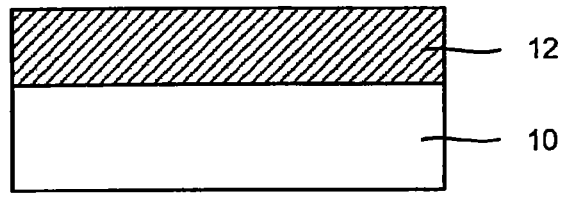
Figure 1C:
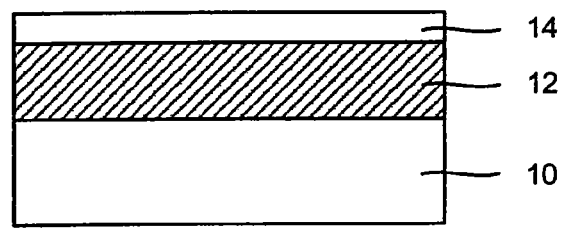
Figure 1D:
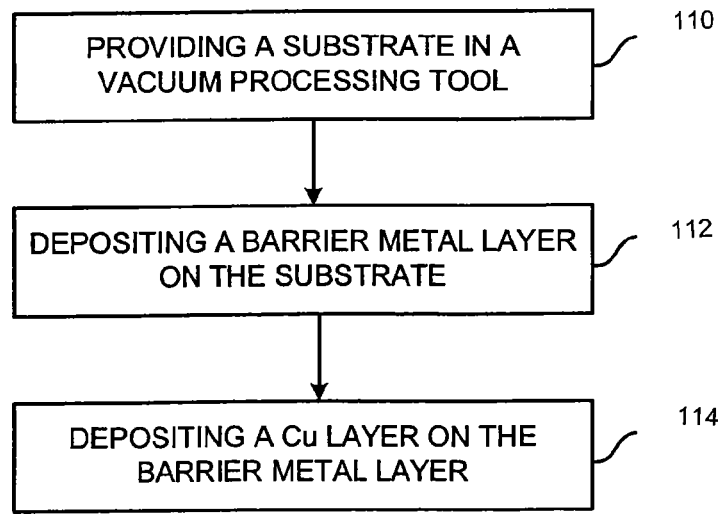
FIG. 1D is a process flow diagram for forming the multilayer structure depicted in FIGS. 1A-1C by integrated processing according to an embodiment of the invention.

FIGS. 1A-1C schematically show formation of a multilayer structure according to an embodiment of the invention, and FIG. 1D is a process flow diagram for forming the multilayer structure depicted in FIGS. 1A-1C by integrated processing according to an embodiment of the invention.

In step 110 of FIG. 1D, a substrate (wafer) 10 is provided in a vacuum processing tool such as the tool 500. Process steps will be discussed hereafter with respect to exemplary vacuum processing tool 500 of FIG. 5. The substrate 10 can, for example, be a Si substrate. A Si substrate can be of n- or p-type, depending on the type of device being formed. The substrate 10 can be of any size, for example a 200 mm substrate, a 300 mm substrate, or an even larger substrate. The substrate 10 can be a patterned substrate containing one or more vias or trenches, or combinations thereof.

The substrate 10 is provided in the cassette modules 501A or 501B for processing in the vacuum processing tool 500. The substrate 10 is introduced into the substrate transfer system 503 from the substrate transfer system 501 through the gate valve G1 and the load lock chamber 502A or through the gate valve G2 and the load lock chamber 502B, after a substrate aligning step in the substrate alignment module 501C. The substrate is then transferred from the substrate transfer system 503 to the processing system 504A through the gate valve G5. In the processing system 504A, the substrate may be degassed by heating and/or exposing the substrate 10 to ultraviolet irradiation in an inert gas environment to remove water and any residual gas from the substrate 10.

After degassing in the processing system 504A, the substrate 10 is returned to the substrate transfer system 503 through the gate valve G5 and next the substrate is transported to the (precleaning) processing system 504B through the gate valve G6. Following the precleaning, the substrate 10 is returned to the substrate transfer system 503 through the gate valve G6, and then transferred to the substrate transfer system 505 from the substrate handling chamber 504D through the gate valve G8. Once in the substrate transfer system 505, the substrate is introduced into the processing system 506A through the gate valve G9 for depositing, in step 112, a barrier metal layer 12 onto the substrate 10 as depicted in FIG. 1B.

After deposition of the barrier metal layer 12, the substrate 10 is returned to the substrate transfer system 505 through the gate valve G9. Next, the substrate is introduced into the processing system 506B through the gate valve G10 for depositing, in step 114, a Cu layer 14 onto the barrier metal layer 12 as depicted in FIG. 1C. Then the substrate 10 is returned to the substrate transfer system 505 through the gate valve G10 and to the substrate transfer system 503 through the gate valve G8 and the substrate handling chamber 504D.

Next, the substrate is returned to the substrate transfer system 501 from the substrate transfer system 503 through the gate valve G3, load lock chamber 502A and the gate valve G1, or through the gate valve G4, the load lock chamber 502B and the gate valve G2. Thereafter, the substrate is returned to the cassette module 501A or 501B and removed from the vacuum processing tool 500 for plating bulk Cu onto the processed substrate of FIG. 1C.

The Cu layer 14 provides nucleation sites for the Cu plating and reduces the terminal ('resistive substrate') effect that is commonly encountered in electrochemical plating processing where a non-uniform thickness of the plated Cu layer over the whole substrate (wafer) is observed. The terminal effect is the tendency for the current density to be non-uniform as a result of the ohmic potential drop associated with conducting current from the substrate edge to the entire substrate surface through a thin resistive layer. This problem can be more severe for a relatively high resistance non-Cu layer (e.g., a Ta-containing layer, a W-containing layer, or a Ru layer) than a lower resistivity Cu layer. The sheet resistance of a non-Cu layer can be orders of magnitude higher than that of today's Cu seed layers and straightforward extension of methods currently used to manipulate current distribution (e.g., electrolyte conductivity) generally may not be adequate to combat the terminal effect experienced using a non-Cu seed layer without the non-conformal Cu layer. A thickness of the Cu layer 14 can, for example, between about 1 nm and about 50 nm.

Still referring to FIGS. 1A-1C, according to embodiments of the invention, the barrier metal layer 12 may contain $TaN_x$, $TaC_xN_y$, Ta, $TaC_x$, Ti, $TiN_x$, $WN_x$, and W materials. These materials are hereafter referred to as TaN, TaCN, Ta, TaC, TiN, Ti, WN, and W. In one example, a thickness of the barrier metal layer 12 can between 0.5 nm and 5 nm, or between 1 nm and 3 nm.

Figure 2A:
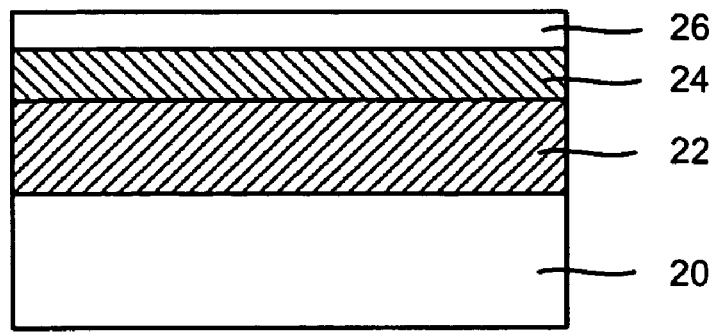
FIGS. 2A, 3A, and 4A are schematic cross-sectional views of other multilayer structures according to embodiments of the invention.
Figure 2B:
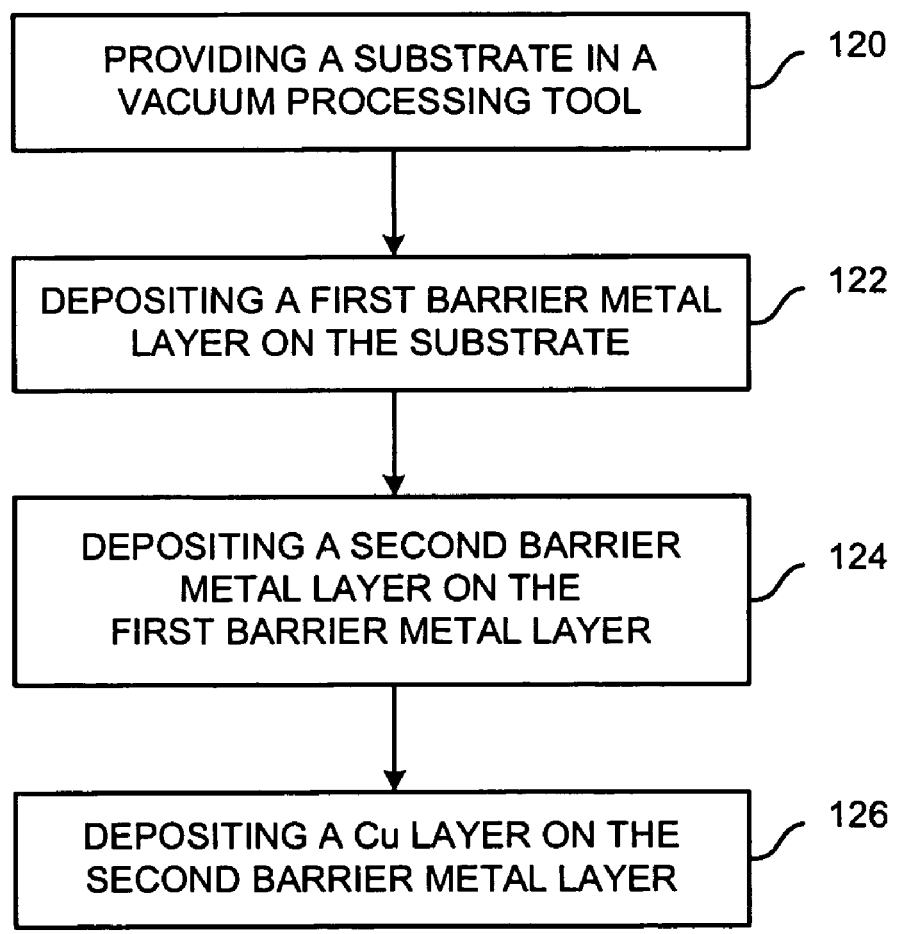
FIGS. 2B, 3B, and 4B are process flow diagrams for forming the multilayer structures depicted in FIGS. 2A, 3A, and 4A, respectively, by integrated processing according to embodiments of the invention.

Referring now to FIGS. 2A, 2B, and 5. FIG. 2A is schematic cross-sectional view of a multilayer structure and FIG. 2B is a process flow diagrams for forming the multilayer structure of FIG. 2A according to an embodiment of the invention.

In step 120, a substrate (wafer) 20 is provided in the vacuum processing tool 500, for example. As described above, the substrate 20 may be degassed and precleaned prior to deposition of a barrier metal layer on the substrate 20. Following the precleaning, the substrate is returned to the substrate transfer system 503 through the gate valve G6, and then transferred to the substrate transfer system 505 from the substrate handling chamber 504D through the gate valve G8.

Once in the substrate transfer system 505, the substrate is introduced into the processing system 506A through the gate valve G9 for depositing, in step 122, a first barrier metal layer 22 onto the substrate 20 as depicted in FIG. 2A. After formation of the first barrier metal layer 22 in the processing system 506A, a second barrier metal layer 24 may be deposited, in step 124, onto the first barrier metal layer 22 in the processing system 506A. Alternately, the substrate 20 may returned to the substrate transfer system 505 through the gate valve G9 and introduced into the processing system 506D through the gate valve G12 for depositing, in step 124, the second barrier layer 24.

According to one embodiment of the invention, the first and second barrier metal layers 22 and 24 may contain alternating Ta-containing layers, including TaN, TaCN, TaC, and Ta. For example, the Ta-containing layers can include TaN/Ta, Ta/TaN, TaCN/Ta, Ta/TaCN, TaCN/TaN, TaC/Ta, or Ta/TaC. According to another embodiment of the invention, the first and second barrier metal layers 22 and 24 may contain alternating Ti-containing layers, including TiN/Ti or Ti/TiN. According to yet another embodiment of the invention, the first and second barrier metal layers 22 and 24 may contain alternating W-containing layers, including WN/W or W/WN. According to yet another embodiment of the invention, the first and second barrier metal layers 22 and 24 may contain Ta-containing layers, Ti-containing layers, or W-containing layers. In one example, a combined thickness of the first and second barrier metal layers 22 and 24 can be between 0.5 nm and 5 nm, or between 1 nm and 3 nm.

Next, the substrate 20 is introduced into the processing system 506B through the gate valve G10 for depositing, in step 126, the Cu layer 26 on the second barrier metal layer. Then the substrate 20 is returned to the substrate transfer system 505 through the gate valve G10 and to the substrate transfer system 503 through the gate valve G8 and the substrate handling chamber 504D. Next, the substrate 20 is returned to the substrate transfer system 501 from the substrate transfer system 503 through the gate valve G3, load lock chamber 502A and the gate valve G1, or through the gate valve G4, the load lock chamber 502B and the gate valve G2. Thereafter, the substrate 20 is returned to the cassette module 501A or 501B and removed from the vacuum processing tool 500 for plating bulk Cu onto the processed substrate of FIG. 2A.

Figure 3A:
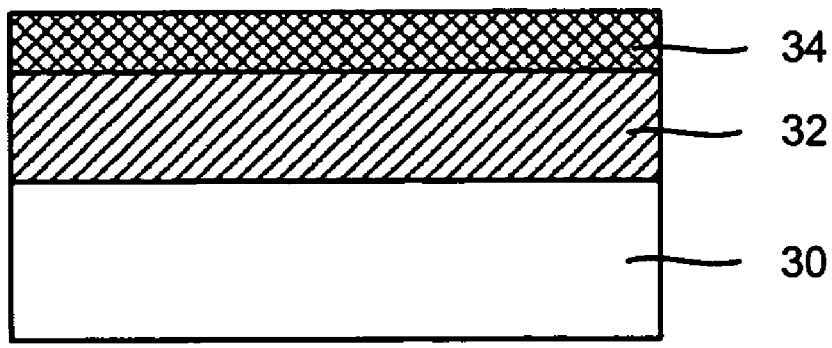
Figure 3B:
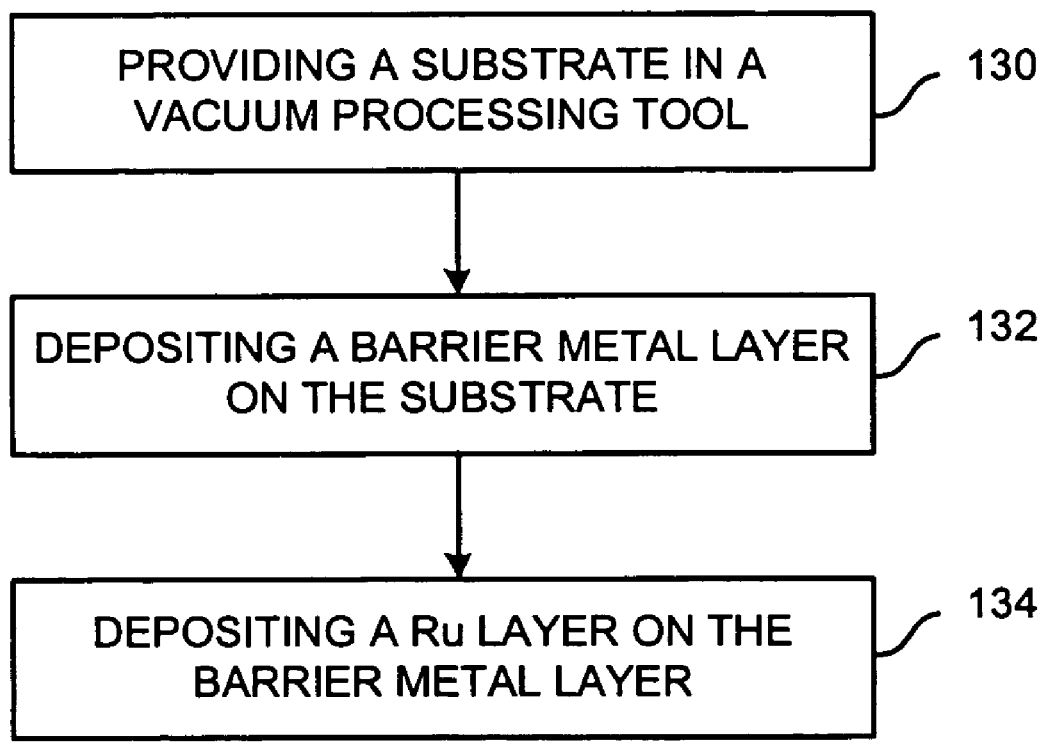

Referring now to FIGS. 3A, 3B, and 5. FIG. 3A is schematic cross-sectional view of a multilayer structure and FIG. 3B is a process flow diagrams for forming the multilayer structure of FIG. 3A according to an embodiment of the invention.

In step 130, a substrate (wafer) 30 is provided in a vacuum processing tool 500, for example. As described above, the substrate 30 may be degassed and precleaned prior to deposition of a barrier metal layer on the substrate 30. Following the pretreating, the substrate is returned to the substrate transfer system 503 through the gate valve G6, and then transferred to the substrate transfer system 505 from the substrate handling chamber 504D through the gate valve G8.

Once in the substrate transfer system 505, the substrate is introduced into the processing system 506A through the gate valve G9 for depositing, in step 134, a barrier metal layer 32 onto the substrate 30. After formation of the barrier metal layer 32 in the processing system 506A, the substrate 30 is returned to substrate transfer system 505 through the gate valve G9 and introduced into the processing system 506C through the gate valve G11 for depositing, in step 132, a Ru layer 34. The Ru layer 34 can, for example, be between 1 nm and 5 nm thick, or between 2 and 5 nm thick.

According to another embodiment of the invention, the barrier metal layer 32 may be replaced by a first and second barrier metal layer as described above in reference to FIGS. 2A-2B. In particular, the substrate 30 may be introduced into the processing system 506A through the gate valve G9 for depositing a first barrier metal layer onto the substrate 30. After formation of the first barrier metal layer in the processing system 506A, a second barrier metal layer may be deposited onto the first barrier metal layer in the processing system 506A. Alternately, the substrate may returned to the substrate transfer system 505 through the gate valve G9 and introduced into the processing system 506D through the gate valve G12 for depositing the second barrier layer on the first barrier metal layer. The Ru layer 34 may then be deposited on the second barrier metal layer in a similar way as previously described with respect to FIGS. 3A and 3B.

Next the substrate 30 is returned to the substrate transfer system 505 through the gate valve G11 and to the substrate transfer system 503 through the gate valve G8 and the substrate handling chamber 504D. Next, the substrate is returned to the substrate transfer chamber 501 from the substrate transfer system 503 through the gate valve G3, load lock chamber 502A and the gate valve G1, or through the gate valve G4, the load lock chamber 502B and the gate valve G2. Thereafter, the substrate is returned to the cassette module 501A or 501B and removed from the vacuum processing tool 500 for plating bulk Cu onto the processed substrate of FIG. 3A.

Figure 4A:
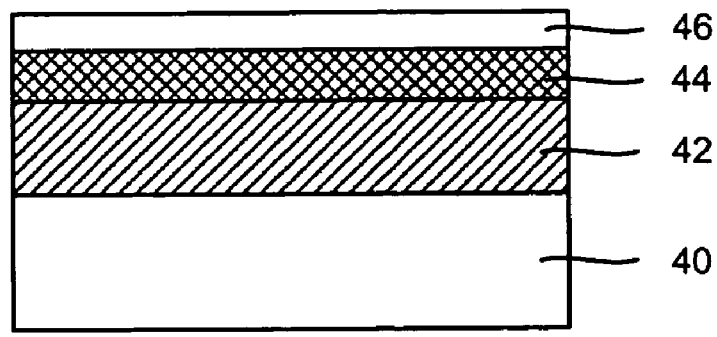
Figure 4B:
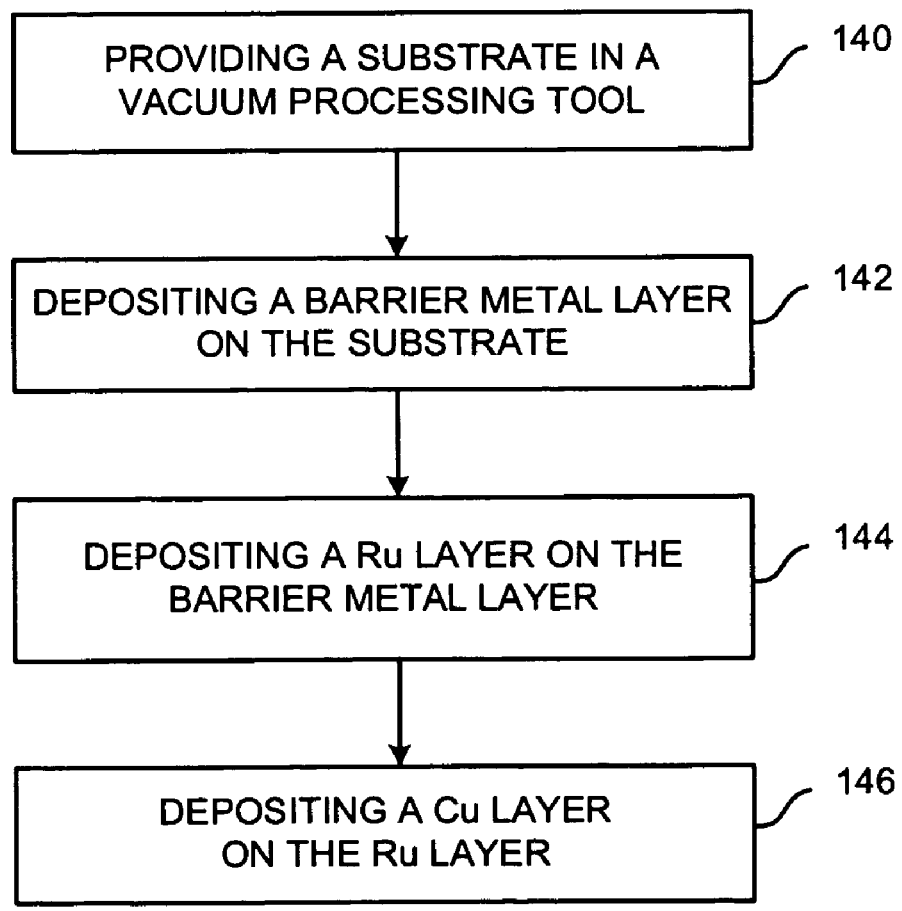

Referring now to FIGS. 4A, 4B, and 5. FIG. 4A is schematic cross-sectional view of a multilayer structure and FIG. 4B is a process flow diagram for forming the multilayer structure of FIG. 4A according to an embodiment of the invention.

In step 140, a substrate (wafer) 40 is provided in a vacuum processing tool 500, for example. As described above, the substrate 40 may be degassed and precleaned prior to deposition of a barrier metal layer on the substrate 40. Following the precleaning, the substrate 40 is returned to the substrate transfer system 503 through the gate valve G6, and then transferred to the substrate transfer system 505 from the substrate handling chamber 504D through the gate valve G8.

Once in the substrate transfer system 505, the substrate is introduced into the processing system 506A through the gate valve G9 for depositing, in step 142, a barrier metal layer 42 onto the substrate 40. After formation of the barrier metal layer 42 in the processing system 506A, the substrate 40 is returned to the substrate transfer system 505 through the gate valve G9 and introduced into the processing system 506C through the gate valve G11 for depositing, in step 144, a Ru layer 44. Next, the substrate 40 is introduced into the processing system 506B through the gate valve G10 for depositing, in step 146, the Cu layer 46.

According to another embodiment of the invention, the barrier metal layer 42 may be replaced by a first and second barrier metal layer as described above in reference to FIGS. 3A-3B. In particular, the substrate 40 may be introduced into the processing system 506A through the gate valve G9 for depositing a first barrier metal layer onto the substrate 40. After formation of the first barrier metal layer in the processing system 506A, a second barrier metal layer may be deposited onto the first barrier metal layer in the processing system 506. Alternately, the substrate 40 may returned to the substrate transfer system 505 through the gate valve G9 and introduced into the processing system 506D through the gate valve G12 for depositing the second barrier layer on the first barrier metal layer. The Ru layer 44 and Cu layer 46 may then be deposited as previously described.

Next the substrate 40 is returned to the substrate transfer system 505 through the gate valve G10 and to the substrate transfer system 503 through the gate valve G8 and the substrate handling chamber 504D. Next, the substrate 40 is returned to the substrate transfer system 501 from the substrate transfer system 503 through the gate valve G3, load lock chamber 502A and the gate valve G1, or through the gate valve G4, the load lock chamber 502B and the gate valve G2. Thereafter, the substrate is returned to the cassette module 501A or 501B and removed from the vacuum processing tool 500 for plating bulk Cu onto the processed substrate of FIG. 4A.

Although only certain embodiments of this invention have been described in detail above, those skilled in the art will readily appreciate that many modifications are possible in the exemplary embodiment without materially departing from the novel teachings and advantages of this invention. Accordingly, all such modifications are intended to be included within the scope of this invention.

What is claimed is:

1. A method of integrated substrate processing, comprising:
providing a substrate in a vacuum processing tool comprising a plurality of processing systems configured to process the substrate, and a substrate transfer system configured to transfer the substrate under vacuum conditions between the plurality of processing systems; and
performing an integrated deposition process on the substrate, wherein the plurality of processing systems and the substrate transfer system maintain a base pressure of background gases, including $H_2O$, $O_2$, and $N_2$, at $6.8 \times 10^{-8}$ Torr, or lower, during the integrated deposition process, the integrated deposition process comprising:
depositing a TaN and/or Ta barrier metal layer on the substrate by ionized physical vapor deposition (IPVD), and
depositing a Cu layer on the TaN and/or Ta barrier metal layer by IPVD.

2. The method of claim 1, wherein the plurality of processing systems and the substrate transfer system maintain the base pressure of background gases at $5 \times 10^{-8}$ Torr, or lower.

3. The method of claim 1, wherein the performing comprises:
depositing the TaN and/or Ta barrier metal layer on the substrate in a first processing system,
transferring the substrate from the first processing system to a second processing system using the substrate transfer system, and
depositing the Cu layer on the TaN and/or Ta barrier metal layer in the second processing system.

4. The method of claim 1, wherein the performing comprises:
depositing the TaN barrier metal layer on the substrate in a first processing system,
depositing another barrier metal layer on the first barrier metal layer in the first processing system,
transferring the substrate from the first processing system to a second processing system using the substrate transfer system, and
depositing the Cu layer on the other barrier metal layer in the second processing system.

5. The method of claim 1, wherein the performing comprises:
depositing a TaN barrier metal layer on the substrate in a first processing system,
transferring the substrate from the first processing system to a second processing system using the substrate transfer system,
depositing another barrier metal layer on the first barrier metal layer in the second processing system,
transferring the substrate from the second processing system to a third processing system using the substrate transfer system, and
depositing the Cu layer on the other barrier metal layer in the third processing system.

6. The method of claim 1, further comprising plating Cu onto the Cu layer.

7. A method of integrated substrate processing, comprising:
providing a substrate in a vacuum processing tool comprising a plurality of processing systems configured to process the substrate and a substrate transfer system configured to transfer the substrate under vacuum between the plurality of processing systems; and
performing an integrated deposition process on the substrate, wherein the plurality of processing systems and the substrate transfer system maintain a base pressure of background gases, including $H_2O$, $O_2$ and $N_2$, at $6.8 \times 10^{-8}$ Torr, or lower, during the integrated deposition process, the integrated deposition process comprising:
depositing a TaN and/or Ta barrier metal layer on the substrate by ionized physical vapor deposition (IPVD), and
depositing a Ru metal layer on the TaN and/or Ta barrier metal layer.

8. The method of claim 7, wherein the plurality of processing systems and the substrate transfer system maintain the base pressure of background gases at $5 \times 10^{-8}$ Torr, or lower.

9. The method of claim 7, wherein the performing comprises:
depositing the TaN and/or Ta barrier metal layer on the substrate in a first processing system,
transferring the substrate from the first processing system to a second processing system using the substrate transfer system, and
depositing the Ru metal layer on the TaN and/or Ta barrier metal layer in the second processing system.

10. The method of claim 9, wherein the performing further comprises:
transferring the substrate from the second processing system to a third processing system, and
depositing a Cu layer on the Ru metal layer in the third processing system.

11. The method of claim 7, wherein the performing comprises:
- depositing the TaN barrier metal layer on the substrate in a first processing system,
- depositing another barrier metal layer on the first barrier metal layer in the first processing system,
- transferring the substrate from the first processing system to a second processing system using the substrate transfer system, and
- depositing the Ru metal layer on the other barrier metal layer in the second processing system.

12. The method of claim 11, wherein the performing further comprises:
- transferring the substrate from the second processing system to a third processing system using the substrate transfer system, and
- depositing a Cu layer on the Ru metal layer in the third processing system.

13. The method of claim 7, wherein the performing comprises:
- depositing the TaN barrier metal layer on the substrate in a first processing system,
- transferring the substrate from the first processing system to a second processing system using the substrate transfer system,
- depositing another barrier metal layer on the first barrier metal layer in the second processing system,
- transferring the substrate from the second processing system to a third processing system using the substrate transfer system, and
- depositing the Ru metal layer on the other barrier metal layer in the third processing system.

14. The method of claim 13, wherein the performing further comprises:
- transferring the substrate from the third processing system to a fourth processing system using the substrate transfer system, and
- depositing a Cu layer on the Ru metal layer in the fourth processing system.

15. The method of claim 7, further comprising plating Cu onto the substrate.

16. The method of claim 7, wherein the Ru metal layer is deposited by a thermal chemical vapor deposition (TCVD) process using a process gas comprising $Ru_3(CO)_{12}$ and CO.

17. The method of claim 10, further comprising plating Cu onto the substrate.

* * * * *